United States Patent
Olzak

[11] Patent Number: 6,040,526
[45] Date of Patent: Mar. 21, 2000

[54] ACCESS PANEL RETENTION DEVICE

[75] Inventor: Richard A. Olzak, Kirkland, Wash.

[73] Assignee: AlliedSignal, Morristown, N.J.

[21] Appl. No.: 09/054,168

[22] Filed: Apr. 2, 1998

[51] Int. Cl.[7] ...................................................... H05K 5/06
[52] U.S. Cl. ........................ 174/52.1; 174/52.2; 174/52.3; 220/3.8; 220/3.9; 220/88.1
[58] Field of Search .................................. 174/52.1, 52.2, 174/52.3, 17 VA; 220/4.02, 3.8, 3.9, 327, 328, 784, 786, 788, 88.1

[56] References Cited

U.S. PATENT DOCUMENTS

| | | | |
|---|---|---|---|
| 3,974,933 | 8/1976 | Toth et al. | 220/3.8 |
| 4,328,901 | 5/1982 | Gunderman et al. | 220/88 A |
| 4,664,281 | 5/1987 | Falk et al. | 220/3.8 |
| 4,694,119 | 9/1987 | Groenewegen | 174/52 PE |
| 4,944,401 | 7/1990 | Greonewegen | 206/521 |
| 5,123,538 | 6/1992 | Groenewegen | 206/521 |
| 5,425,466 | 6/1995 | Bambacigno | 220/203.09 |
| 5,438,162 | 8/1995 | Thompson et al. | 174/52.2 |
| 5,756,934 | 5/1998 | Purdom | 174/52.1 |

Primary Examiner—Kristine Kincaid
Assistant Examiner—W. David Walkenhorst

[57] ABSTRACT

A crash-survivable enclosure assembly (5) for protecting a data memory unit (45) used in vehicles. The crash-survivable enclosure assembly has an enclosure (10) which has an access opening (30) and an inner enclosure surface (22). A fixed position access panel support element (36), which has inner (73) and outer (74) support surfaces, extends inward from inner enclosure surface (22). Enclosure assembly (5) also has a removable access panel (50), which has a panel inner surface (51), positioned against outer support surface (74) of support element (36). The inner enclosure surface and the access panel inner surface form an inner cavity which is used to store the data memory unit. Enclosure assembly (5) has a retention device (60) which is used to secure access panel (50) to enclosure (10). Retention device (60) has a mechanical member, with a main surface mounted against the inner support surface of the support element. Extending from the main surface of the mechanical member is a fulcrum (62). The fulcrum engages the access panel inner surface. A fastener element (55) is used to bias the mechanical member and the access panel towards one another forcing the fulcrum to press against the panel inner surface. In biasing the access panel and mechanical member together, the support element is captured between the access panel and the mechanical member.

21 Claims, 5 Drawing Sheets

ACCESS PANEL RETENTION DEVICE

BACKGROUND OF THE INVENTION

1. Field of the Invention

The present invention relates to crash-survivable enclosures for data memory units used in aircraft and other vehicles operating over land and water. More particularly, the invention is directed to a retention device for use in a crash-survivable enclosure.

2. Description of the Prior Art

Solid state memory devices have been used in data recorders for recording essential data or information useful in determining causes of crashes or other mishaps in aircraft and other vehicles. When a crash occurs, it is essential that the recorded information on board survive the crash and subsequent events including heat, cold, flame, and fire that may afterwards ensue. In the event that the crash occurs over the ocean or other large body of water, the recorded information must be protected from the hydraulic pressure effects of deep water submersion.

Generally, it is desirable to protect voice and operational data supplied to the memory unit during a predetermined time interval immediately prior to a crash. In this regard, in order to preserve the data, the memory unit must be enclosed in a protective device configured and arranged to withstand temperatures in excess of 1,100° C. (approximately 2,000° F.) experienced during a fire and pressures up to 8,660 psi experienced at ocean depths of up to 20,000 feet. Simultaneously, the enclosure must be constructed to endure crushing and penetration forces experienced either on impact or during secondary impact with other portions or pieces of the vehicle.

Typical enclosures designed to meet these constraints are usually bulky, hemispherical enclosures, which have large space, weight, and power requirements. These requirements generally prohibit the use of most crash-survivable enclosures in small vehicles such as, general aviation aircraft, railroad passenger/cargo cars, buses, or cargo trucks.

Suitable access to the data memory unit is yet another design constraint that tends to drive size and shape requirements for typical enclosures. A removable door or panel, which provides access to the data memory unit, must be fastened to the enclosure without reducing the enclosure's ability to endure a crash. In ordinary crash-survivable enclosures, an access panel is typically bolted down into threads on the main body of the enclosure or onto a flange or similar mounting surface. The flange usually extends out beyond the circumferential surface of the enclosure and does not allow for venting. To maintain the structural integrity of the enclosure during a crash, the crash-survivable enclosures must be relatively large, with thick-walls to accommodate the threaded holes, fasteners and flanges.

In view of these limitations, a retention device is needed that can be used with a crash-survivable enclosure, which has a reduced size, a light weight, and a low power requirement. It would also be desirable to have a retention device that can secure an access panel to the enclosure without reducing the structural integrity of the enclosure and while removing the need for large, bulky flanges, thick-walled enclosure structures, and large numbers of fasteners.

SUMMARY OF THE INVENTION

The present invention provides a retention device for securing an access panel onto a small, light-weight, crash-survivable, protective enclosure. The retention device is capable of securing an access panel onto a crash-survivable enclosure, while maintaining the structural integrity of the enclosure, even when the enclosure is subjected to a force of up to 3,400 Gs. The retention device also removes the need for threaded holes to be placed into the wall of the enclosure. Thus, a thick-walled enclosure is not required. The retention device secures the access panel to a relatively small lip or rim disposed on an inside surface of the enclosure shell. Therefore, large, bulky flange structures are also not required. Thus, with these requirements removed, the crash-survivable enclosure can be made smaller and lighter weight than typical crash-survivable enclosures.

In one embodiment, a crash-survivable enclosure assembly is provided for protecting a data memory unit used in vehicles. The crash-survivable enclosure assembly has an enclosure which has an access opening and an inner enclosure surface. A fixed position access panel support element, which has inner and outer support surfaces, extends inward from the inner enclosure surface. The enclosure assembly also has an access panel. A removable access panel, which has a panel inner surface, is positioned against the outer support surface of the support element. The inner enclosure surface and the access panel inner surface form an inner cavity which is used to store the data memory unit. The enclosure assembly also has a retention device which is used to secure the access panel to the enclosure. The retention device has a mechanical member, which has a main surface mounted against the inner support surface of the support element. Extending from the main surface of the mechanical member is a fulcrum. The fulcrum engages the access panel inner surface. A fastener element is used to bias the mechanical member and the access panel towards one another forcing the fulcrum to press against the panel inner surface. In biasing the access panel and mechanical member together, the support element is captured between the access panel and the mechanical member.

In yet another embodiment, an enclosure is provided which has an access opening and an inner cavity. Adjacent to the access opening, the enclosure also has a captured portion. An access panel, with an inner panel surface, is removably positioned over the access opening, for enclosing the inner cavity. The enclosure assembly also has a retention device. The retention device is made up of a mechanical member, with a main surface, a fulcrum, extending inwardly from the main surface, and a threaded hole, formed into the mechanical member through the main surface. A threaded fastener element is also included which biases the mechanical member and the access panel towards one another so the fulcrum presses against the panel inner surface and the captured portion of the enclosure is captured between the mechanical member main surface and the access panel inner panel surface.

In another aspect of the invention, a process is provided for securing a removable access panel to a crash-survivable enclosure assembly. The enclosure assembly is used to protect a data memory unit used in vehicles. The steps of the process include selecting an enclosure having a plurality of openings formed into a surface of the enclosure; inserting a retention device into at least some of the plurality of openings, where the retention device has a fulcrum disposed on a main surface of the retention device; mounting an access panel, which has an inner surface, over an access opening of the enclosure; inserting a fastener element into a through-hole, which is formed into the access panel, for each retention device; mechanically engaging the retention devices by the fastener elements; and biasing the mechanical member and the access panel towards one another with the fastener element so the fulcrum presses against the panel inner surface and a portion of the enclosure is captured between the access panel and the retention device.

Other features and advantages of the invention will appear from the following description in which the preferred embodiment has been set forth in conjunction with the accompanying drawings.

DESCRIPTION OF THE PREFERRED EMBODIMENT

Figure 1:
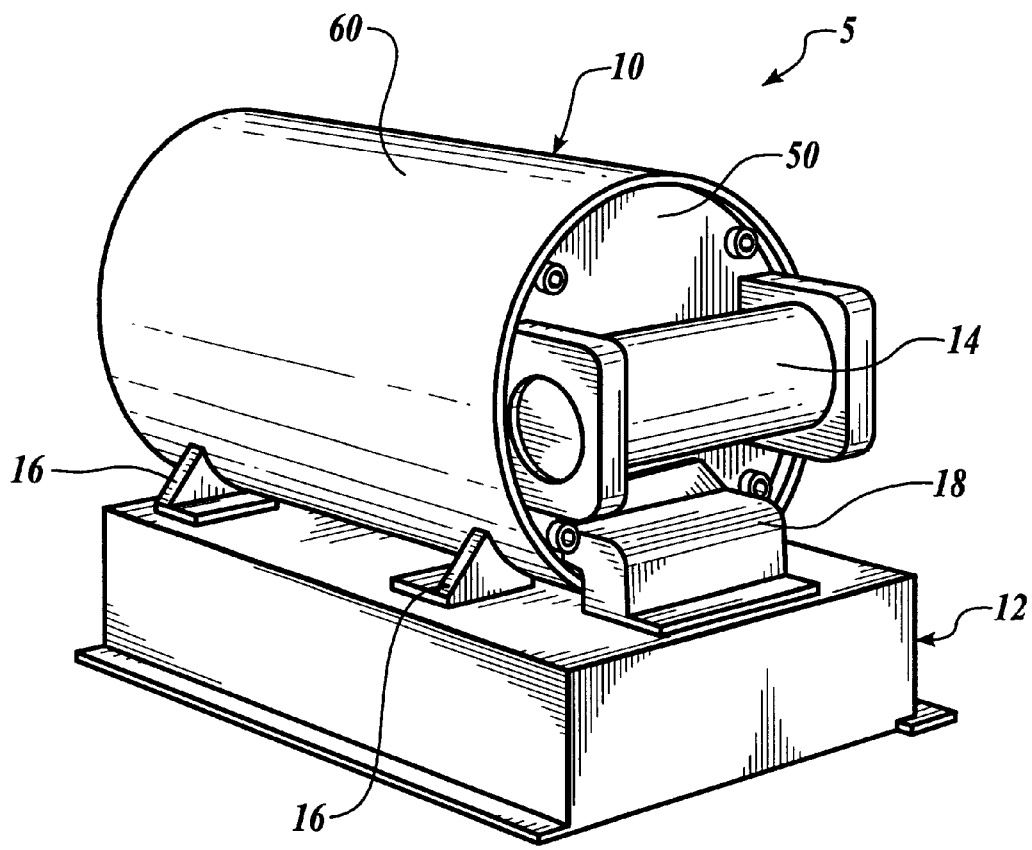
FIG. 1 is a perspective view of a data recorder assembly which includes a retention device according to the present invention and a crash-survivable enclosure.

Referring to FIG. 1, a data recorder assembly 5, according to the present invention, is shown and includes a data memory unit enclosure 10 mounted to a universal carrier housing 12 by foot mounts 16 with an underwater locating beacon 14 mounted adjacent to a recessed access panel 50 of enclosure 10. Carrier housing 12 is adaptable to fit into a vehicle of choice.

Assembly 5 also includes a flex cover 18 which provides a pathway from internal cavity 26 of the enclosure through universal carrier housing 12 for power supply leads and data transmission lines. A conventional underwater locating beacon (ULB) 14 is mounted on an outer surface of enclosure 10 to give ready access for battery check and/or replacement.

The incident (e.g., crash) site often contains debris. Moreover, it may also be underwater. To aid in locating the protective portion of the system, enclosure 10 is finished in a durable, abrasion protective, brightly colored material, such as bright orange, that enhances identification at an incident site.

Access to the internal portion of data memory unit enclosure 10 for data retrieval after an accident is assured by way of a uniquely retained, removable access panel 50 (described below), which is removable by virtue of a floating retention system 60 that reduces the shear forces on the critical retention hardware. Floating retention system 60 is described below in more detail.

Figure 2:
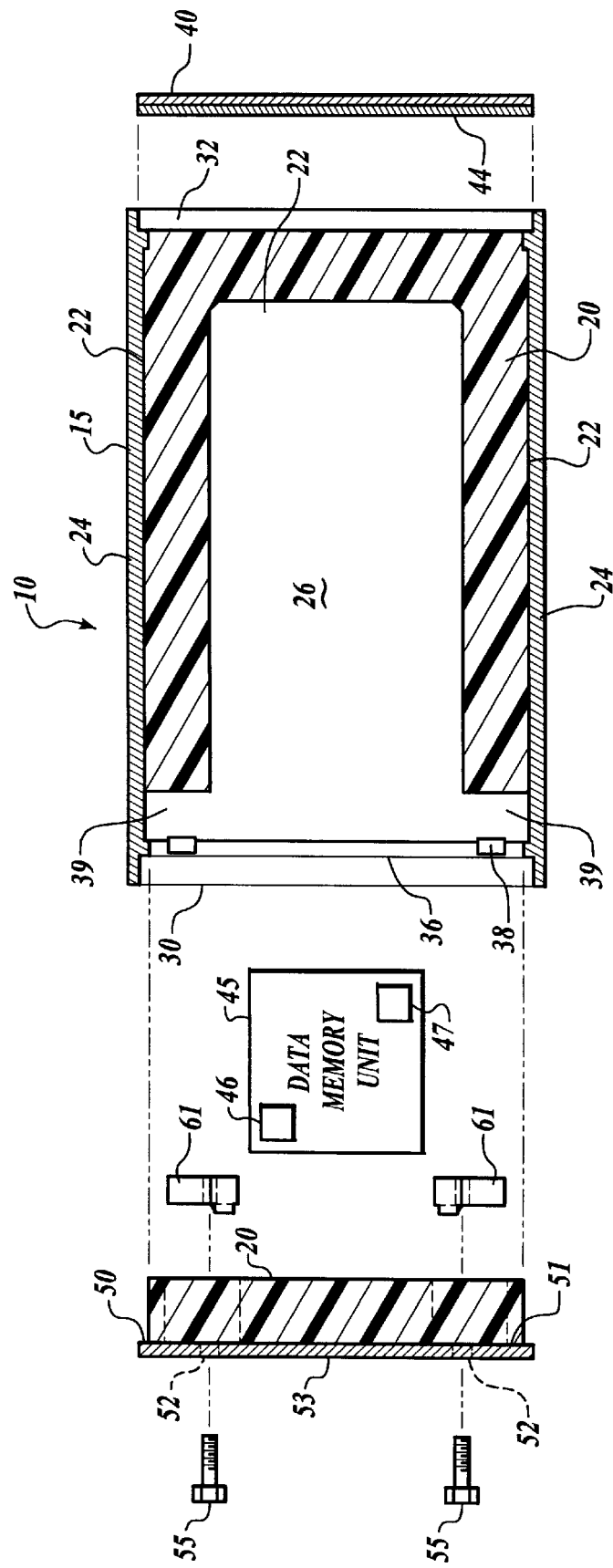
FIG. 2 is an exploded cross-sectional view of the crash-survivable enclosure of FIG. 1.

Generally, thermally protected data memory unit enclosure 10, as represented in FIG. 2, includes a shell 15 having an inner surface 22, outer surface 24, and first and second plain, open ends 30, 32. First open end 30 is enclosed by access panel 50. Second open end 32 is enclosed by end cover 40.

Enclosure 10 can be configured in any suitable shape, and is preferably generally cylindrical in shape as shown in FIG. 1. Protective, crash-survivable data memory unit enclosure 10 uses the natural strength advantage of a continuous cylindrical form to obtain the maximum resistance to penetration and crushing using a minimum amount of hardened material, thereby conserving the weight needed to provide the impact/penetration resistance required to survive a crash or other vehicle disaster. Shell 15 of enclosure 10 is typically constructed of a metal, preferably, hardened stainless steel or titanium, that has a high resistance to crushing and piercing, but also exhibits a high thermal conductivity. Another advantage of using cylindrical shaped shell 15 is that it provides relatively less surface area exposure to heat and/or flames that may be present in a crash. An intumescent coating or paint is generally applied to the exterior surfaces of the shell for additional thermal protection. The combination of a high strength advantage and a low surface area exposure to heat environments, permits enclosure 10, protecting data memory unit 45, to be made smaller than conventional enclosures, without sacrificing heat protection for the data memory unit contained therein.

Enclosure 10 is also free of material extending radially beyond outer circumferential surface 24 of shell 15 and axially beyond plain open ends 30, 32 of shell 15. FIG. 2 also shows a heat absorption material 20, which lines each interior surface 22 of shell 15 to form an interior, cup shaped, cavity 26 centrally located within shell 15, cavity 26 housing a data memory unit 45. Access panel 50 also has a portion of its inner surface 51 covered with heat absorption material 20.

Heat absorption composition 20 provides the heat shielding necessary to protect data memory unit 45 from a high temperature environment. In a fire or other high temperature environment, heat absorption composition 20 acts as a heat shield initially, by exhibiting a relatively high thermal inertia. When composition 20 reaches the phase transition point, it acts as a heat sink by utilizing the heat energy needed to convert the composition from the solid phase to the liquid phase in an endothermic transition. The use of the heat energy to produce this phase transition maintains the maximum temperature environment at an acceptable level.

In addition to its utility as a heat absorbing material, composition 20 is also useful in enclosure 10 as a shock absorbing material. For example, enclosure 10 may be subjected to intense shock in the area of 3400 Gs on impact during crash conditions. Under such physical impact force, the composition absorbs a portion of the shock by deforming only enough to divert the impact shock wave away from the memory device, but not enough to penetrate any surrounding insulation creating voids that might become heat flux paths to data memory unit 45. The density of the composition is naturally appropriate for this application.

In one particular embodiment, the composition is an amide-type synthetic organic wax, which is commercially available in the industry for a variety of uses unrelated to heat absorption. Composition 20 includes between about 35 percent and about 45 percent by weight of a first amide wax, an N,N'-ethylenebisstearamide (also known as N,N'-distearoylethylenediamine) wax, having a melting point of between 232° C. and 240° C. One example of this wax is commercially available from Lonza, Industries of Fair Lawn, N.J. under the trade ACRAWAX HMS®. The composition also includes between about 65 percent and about 55 percent by weight of a second amide wax, N,N'-ethylenebisstearamide, having the empirical formula $H_{33}C_{17}COHNC_2H_4NHCOC_{17}H_{35}$, and a melting point of about 120° C. One example of this wax is commercially available from Lonza, Industries of Fair Lawn, N.J. under the trade name ACRAWAX C®. In a preferred embodiment, the composition includes 40 percent by weight of the first wax component having a melting point of between 232° C. and 240° C. and about 60 percent by weight of the second wax component having a melting point of 120° C.

In yet another embodiment, heat absorption composition 20 is a polyoxymethylene polymer composition. In the event of a crash, the data memory unit may be subjected to temperatures in the range of 1,100° C. for up to an hour. The polymer undergoes endothermic decomposition when the enclosure is subjected to high heat.

Polymers having the suitable general characteristics are commercially available in the art and may be known as "paraformaldehyde". Another polymer having the foregoing general characteristics is commercially available under the trade name DELRIN® from DuPont. Those skilled in the polymer art may readily identify other suitable commercially available polymers having the foregoing general characteristics by reference to any of several chemical reagent supplier catalogues.

In yet another embodiment, heat absorption composition 20 employed in the present invention, includes a bicarbonate compound and a binder. Suitable bicarbonate compounds will be readily apparent to those skilled in the art. Specific examples of suitable bicarbonate compounds include but are not limited to sodium bicarbonate, potassium bicarbonate and ammonium bicarbonate. Sodium bicarbonate is currently preferred because of its ready availability and low cost. Preferably, the bicarbonate compound and binder will be formulated having between about 10 percent and about 99 percent by weight of a bicarbonate compound and between about 90 percent and 1 percent by weight of a binder.

A complete and thorough description of the heat absorption compositions described above are found in commonly assigned and currently pending U.S. patent application Ser. No. 08/963,948, filed Nov. 4, 1997, U.S. Pat. No. 5,932,839 issued to Ren et al. on Aug. 3, 1999, and U.S. Pat. No. 5,810,919 issued to Olzak et al. on Sep. 22, 1998, the full disclosures of which are incorporated herein by reference.

The compositions described above provide a number of advantages. The components of the compositions are relatively easy to handle, relatively low in cost, formable, and more effective at heat absorption as compared to conventional heat absorption materials. Because the composition absorbs heat more efficiently than conventional heat absorption agents, enclosure 10, protecting data memory unit 45, which includes composition 20 of the present invention, can be made smaller than conventional enclosures, without sacrificing heat absorption protection for the data memory unit contained therein.

In a preferred embodiment of the invention, data memory unit 45 is a solid state electronic memory device, which includes a data memory board 46 and a controller board 47, for storing data which is to be recovered from the device following exposure of the enclosure to a crash and/or a high temperature environment. An example of such a device includes a semiconductor, electronically erasable, programmable, read-only, memory circuit. A data acquisition unit periodically supplies digital signals which are sequentially written into semiconductor memory circuit so that the memory circuit stores a sequence of digital words that is a time sampled data representation of the history for each parameter being monitored. Typically, with respect to currently employed techniques, data compression is generally employed to allow storing of digital signals representative of a 15–30 minute time history for each monitored parameter.

Figure 3:
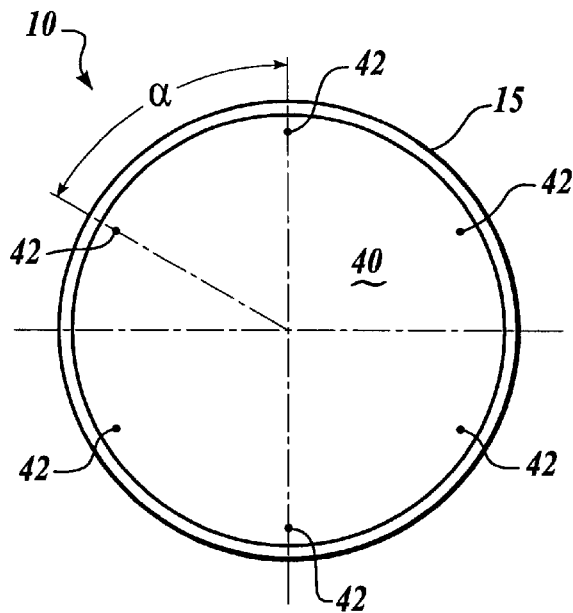
FIG. 3 is an elevation view of the crash-survivable enclosure of FIG. 1, showing an end cover according to an embodiment of the present invention.
Figure 4:
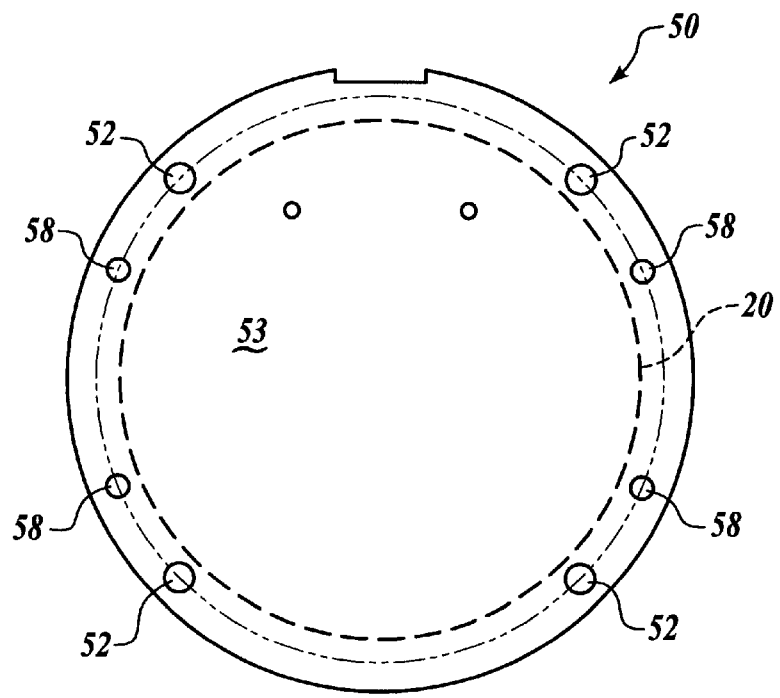
FIG. 4 is a front view of the access panel of FIG. 1.
Figure 5A:
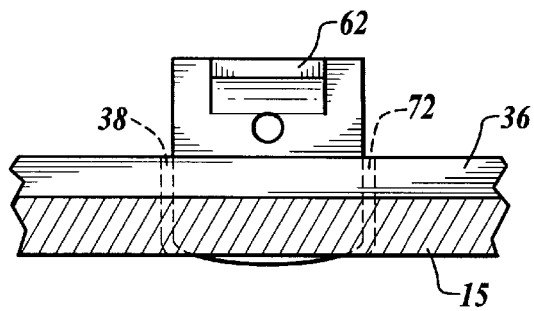
FIGS. 5A–5C are simplified illustrations of the retention device of FIG. 1.
Figure 5B:
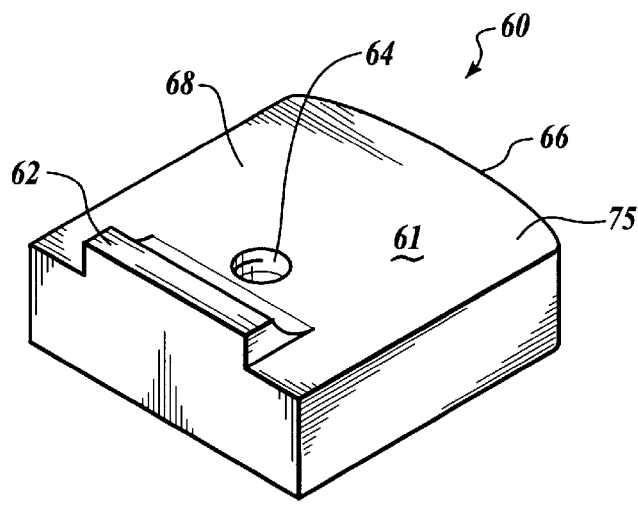
Figure 5C:
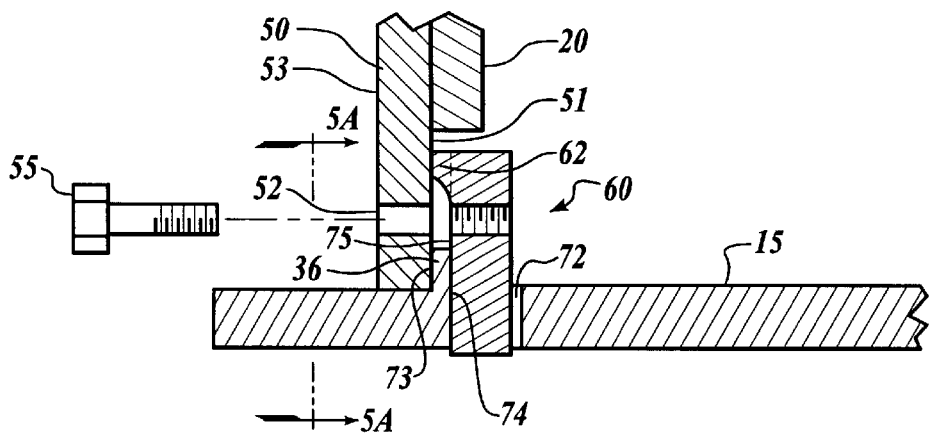

Referring to FIGS. 2 and 3, shell 15 of enclosure 10 includes a plurality of vents 42 which provide communication between the outer environment and inner cavity 26. Vents 42 are sized and positioned to permit heat absorption material 20 to flow from shell 15 when in the non-solid, flowable phase. In the event that enclosure 10 becomes submerged, vents 42 provide for the equalizing of pressure between the outer submerged environment and inner cavity 26. Enclosure 10 may be submerged up to depths of 20,000 feet and subjected to pressures up to 8,660 psi in a crash occurring, for example, over the ocean. At such depths, the equalization of pressure prevents crushing of shell 15 and subsequent damage to data memory unit 45.

In a preferred embodiment, vents 42 are a plurality of substantially small holes arranged, for example, on the periphery of a back cover 40 or front cover 50, at predetermined intervals. The intervals are configured on shell 15 to provide omni-directional venting, such that a liquid composition can be drained from shell 15, regardless of the orientation of the tube. Vents 42 also provide suitable omni-directional venting for pressure equalization for a submerged enclosure, as well.

In an alternative embodiment, the holes may be capped. The caps can take many forms, which include, for example, a material that burns away or is dissolved by the liquid composition or exposure to sea water. The caps can also be spring loaded covers that are retained by heat, shock, and depth sensitive devices which release the covers upon impact, exposure to heat, or deep submersion in water.

The liquid phase composition expulsion or the pressure equalization can simultaneously occur, when necessary, through openings 38 located on the side-wall of enclosure 10. Openings 38, as described below, are non-precision, since the manufacturing tolerance of openings 38 are preferably made relatively liberal, thereby allowing expulsion of the flowable phase composition material and pressure equalization to occur as needed.

Referring now to FIGS. 4 and 5A–5C access panel 50 is shown which is mounted onto enclosure 10 and provides access to memory unit 45 for data retrieval. Panel 50 is penetration and fire-proof, and removable by virtue of a floating retention system 60 that reduces the shear forces on the critical retention hardware. Retention system 60 includes high strength retention device 61 developed for such purposes as ensuring the retention of removable access panel 50 in a situation when the unit is subjected to 3,400 Gs of impact force. To accommodate the normal tolerance variations of manufacturer, retention device 61 is designed to use an integrated fulcrum 62 that acts as a floating member, impinging on inside surface 51 of access panel 50. Since cylinder 10 is a pressure-resistant shape, retention device 61 depends on surface 74 of an access panel support element 36 to maintain its bearing surface opposite fulcrum 62. In the initial application of retention device 61, four non-precision openings 38 provide surface 74. Openings 38 are located at predetermined intervals, preferably at 90°, around the crash resistant cylinder 10. Openings 38 are sized liberally to receive a portion of retention device 61 to hold the device in place and keep it from rotating. Openings 38 may be formed partially into shell 15 but preferably extend through the shell. Occurring at four locations around the cylinder, a redundancy of engagement ensures access panel retention, even if 50 percent of retention devices 61 are destroyed in the crash. The retention device material is non-corrosive with adequate radii to prevent stress cracking over time.

A conventional, high strength fastener 55 passes through access panel 50 from outside surface 53 and engages a threaded hole 64 in each retention device 61. Retention device 61 engages fastener 55 in a floating situation, which ensures the parallelism of the retention device to the access panel and ensures that fastener 55 is retained in a perpendicular attitude before any tightening forces are applied. Moreover, fastener 55 penetrates retention device 61 completely before fulcrum 62 is engaged, ensuring a smooth installation of components, free of any binding. To seal access panel 50 against the outer surface 73 of support element 36, fastener 55 biases access panel 50 and fulcrum 62 towards one another so fulcrum 62 presses against panel inner surface 51. Simultaneously, access panel inner surface 51 and main surface 75 of retention device 61 engage surface 74 and outer surface 73 of support element 36 to capture the support element between them.

Figure 6A:
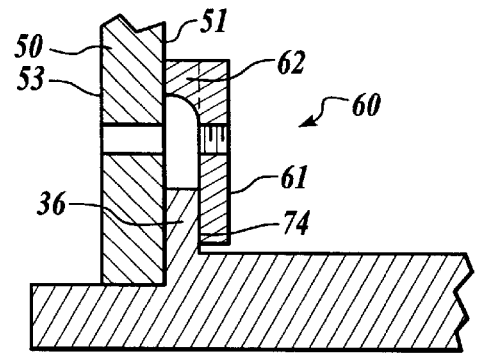
FIGS. 6A–6C are simplified illustrations of alternative embodiments of the present invention.
Figure 6B:
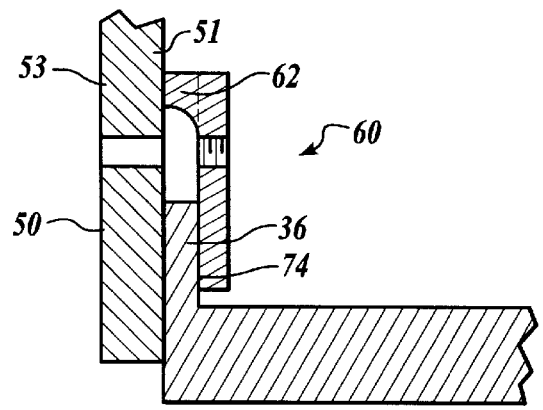
Figure 6C:
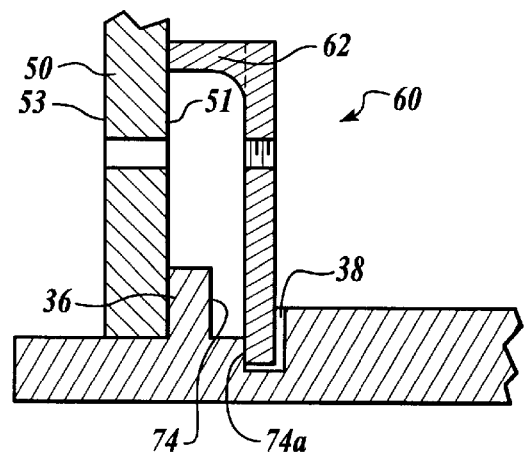

In alternative embodiments of the retention device, illustrated in FIGS. 6A–6B, the retention device is used without openings or slots 38. In this case, support element 36 is a seal ring which extends inward from the inner surface of the enclosure and towards the enclosure opening of enclosure 10. Preferably, seal ring 36 is positioned anywhere from the edge of the access opening to an area recessed within enclosure 10. Seal ring 36 is captured between access panel 50 and mechanical member 61. In FIG. 6C, yet another alternative embodiment is shown. In this embodiment, retention device 60 is disposed with opening 38 which can be either a hole or slot. The fastener element biases main surface 75 of retention device 61 and access panel 50 towards one another so access panel inner surface 51 presses against fulcrum 62 and outer support surface of 36 support ring. Main surface 75 of retention device 61 presses against inner support surface 74a of slot 38, instead of surface 74 of seal ring 36. However, the surfaces 74 and 74a of seal ring 36 and slot 38, respectively, are deemed equivalent surfaces, as long as a portion of enclosure 10 is captured between access panel 50 and retention device 61.

While the retention device has particular adaptability in a cylindrical shell, which presents extra tolerance and design challenges, it is just as serviceable in a straight-walled application. Moreover, the retention device can be used in containers other than crash-survivable enclosures. For example, the retention device can be used to secure access panels onto any container that has thin-walls or is otherwise not capable of being threaded or with no other means for fastener retention.

The advantage of allowing the retention device to float in (i.e., not fixed in) openings 38 is that it permits fastener holes 52 on access panel 50 and seal ring 36 to be produced with generous manufacturing tolerances. The generous tolerances produce gaps 72 and facilitate easy assembly, while reducing production costs. Because of fulcrum 62, openings 38 in the shell sidewall can also be non-precision; this tolerance being accommodated by tightening the through-hole fastener which draws the retention device toward the access panel engaging first fulcrum 62 then shell side-wall 74 by way of slot 38. Once panel 50 is secure against seal ring 36 with the retention device bearing simultaneously on panel 50 and surface 74, tightening fastener 55 puts extra strength retention device 61 in bending, which ensures fastener retention during shock and vibration. The invention is equally able to retain access panel 50 whether the tension forces or the shear forces are generated externally by impact or internally by shock.

Although the essential elements of the retention device are described here as being used with a crash-survivable enclosure, the invention is not so limited. One skilled in the art can envision a number of modifications to the retention device which are based upon possible uses with conventional technology in the art of enclosures, vent doors, entry panels and other devices and are therefore contemplated by the instant invention. For example, the retention device may have a through-hole instead of a threaded hole. In this case, a nut, for example, may be fixed onto the back surface of the retention device to engage the fastener. Also, the openings may be formed into the enclosure, as opposed to through the enclosure, in a blind-slot arrangement.

One skilled in the art can also envision a number of different but similar uses for the retention device and are therefore, also contemplated by the instant invention. For example, the retention device can be used where it is desirable to fasten a panel to enclose a space and where the wall-thickness of the enclosure cannot provide the space or thickness needed for a threaded hole or where there is no room for a fastener to extend beyond the physical boundaries of the enclosure or panel.

What is claimed is:

1. A crash-survivable enclosure assembly for protecting a data memory unit used in vehicles, the crash-survivable enclosure assembly comprising:
   an enclosure having an access opening and an inner enclosure surface;
   a fixed position access panel support element extending inwardly from the inner enclosure surface, the support element having inner and outer support surfaces;
   an access panel, having a panel inner surface, removably positioned against the outer support surface of the support element, the inner enclosure surface and the access panel inner surface defining an inner cavity; and
   a retention device comprising:
      a mechanical member having a main surface mounted against the inner support surface of the support element;
      a fulcrum extending from the main surface and engaging the access panel inner surface; and
      a fastener element biasing the mechanical member and the access panel towards one another so the fulcrum presses against the panel inner surface and the support element is captured between the access panel and the mechanical member.

2. The enclosure assembly of claim 1, wherein the enclosure comprises a substantially right circular cylinder.

3. The enclosure assembly of claim 2, wherein the enclosure further comprises:
   a back plate having a periphery; and
   a vent including a plurality of holes arranged on the periphery of the backplate, wherein the vent provides for flow of gases and liquids into and out from the enclosure.

4. The enclosure assembly of claim 2, wherein the holes are sealed with a meltable sealant.

5. The enclosure assembly of claim 1, wherein the enclosure comprises a plurality of vents permitting the flow of liquids from the inner cavity by gravity regardless of the orientation of the enclosure.

6. The enclosure assembly of claim 1, wherein the support element comprises a ring.

7. The enclosure assembly of claim 1, wherein the mechanical member has a threaded hole, the access panel has a through-hole and the fastener element passes through the through-hole and threadably engages the threaded hole.

8. The enclosure assembly of claim 1, further comprising a heat absorption composition disposed within the inner cavity and surrounding the data memory unit, and wherein the composition exhibits a phase transition when subjected to a high temperature environment, the phase transition being from a solid phase to a liquid phase.

9. The enclosure assembly of claim 1, wherein the enclosure has an opening formed therethrough adjacent to the inner support surface of the support element, the opening housing a portion of the mechanical member.

10. The enclosure assembly of claim 9, wherein the opening is aligned with the inner support surface of the support element.

11. The enclosure assembly of claim 9, further comprising a plurality of retention devices and a plurality of the openings housing the portions of the mechanical members.

12. The enclosure assembly of claim 11, wherein the portions of the mechanical members fit loosely within the openings to create vent openings to provide for flow of fluids into and out of the inner cavity.

13. The enclosure assembly of claim 12, wherein the vent openings are sealed with a meltable sealant.

14. A crash-survivable enclosure assembly comprising:
   a container having an access opening and an inner container surface;
   an access panel support ring extending inwardly from the inner container surface, the support ring having an outer support surface;
   a plurality of slots formed into the container, each said slot defined in part by an inner support surface;
   an access panel removably positioned against the outer support surface of the support ring, the access panel having a panel inner surface, the inner container surface and the access panel inner surface defining an inner cavity; and
   a retention device for each said slot, each retention device comprising:
      a mechanical member having a main surface mounted against the inner support surface of said slot;
      a fulcrum extending from the main surface and engaging the access panel inner surface; and
      a fastener element biasing the mechanical member and the access panel towards one another so the panel inner surface presses against the fulcrum and the outer support surface of the support ring, and the main surface of the mechanical member presses against the inner support surface of said slot.

15. The enclosure assembly of claim 14, wherein the slots are oversized holes formed into the container positioned at a predetermined interval around a circumference of the container.

16. An enclosure assembly comprising:
   an enclosure having an access opening and defining an inner cavity, the enclosure comprising a captured portion adjacent to the access opening;
   an access panel removably positioned over the access opening, for enclosing the inner cavity, the access panel having an inner panel surface; and
   a retention device comprising:
      a mechanical member having a main surface;
      a fulcrum extending inwardly from the main surface of the mechanical member; and
      a threaded hole formed into the mechanical member through the main surface;
      a threaded fastener element biasing the mechanical member and the access panel towards one another so the fulcrum presses against the panel inner surface and the captured portion of the enclosure is captured between the mechanical member main surface and the access panel inner panel surface.

17. A process for securing a removable access panel to a crash-survivable enclosure assembly, the enclosure assembly used to protect a data memory unit used in vehicles, comprising the steps of:
   selecting an enclosure having a plurality of openings formed into a surface of the enclosure;
   inserting a retention device into at least some of the plurality of openings, the retention device having a fulcrum disposed on a main surface of the retention device;
   mounting an access panel, having ail inner surface over an access opening of the enclosure;
   inserting a fastener element into a through-hole, formed into the access panel, for each said retention device;
   mechanically engaging said retention devices by said fastener elements; and
   biasing the mechanical member and the access panel towards one another with the fastener element so the fulcrum presses against the panel inner surface and a portion of the enclosure is captured between the access panel and the retention device.

18. The process of claim 17, wherein the selecting step is carried out using an enclosure which is a continuous, substantially cylindrical tube.

19. The process of claim 17, wherein the selecting step is carried out using an enclosure which further comprises vents for expelling gases and liquids from the enclosure.

20. The process of claim 17, wherein the selecting step is carried out using an enclosure which further comprises a heat absorption composition which lines the inner enclosure surface and wherein the composition exhibits a phase transition when subjected to a high temperature environment, the phase transition being from a solid phase to a liquid phase.

21. The process of claim 17, wherein the biasing step is accomplished by the fastener element threadably engaging a threaded hole formed into the retention device.

* * * * *